United States Patent [19]

Dotson et al.

[11] Patent Number: 5,699,015

[45] Date of Patent: Dec. 16, 1997

[54] LOW VOLTAGE OPERATIONAL AMPLIFIER AND METHOD

[75] Inventors: Robert N. Dotson; Richard S. Griffith, both of Chandler; Thomas D. Petty; Robert L. Vyne, both of Tempe, all of Ariz.

[73] Assignee: Motorola, Inc., Schaumburg, Ill.

[21] Appl. No.: 618,544

[22] Filed: Mar. 19, 1996

[51] Int. Cl.$^6$ .................. H03F 3/45; H03F 3/26; H03F 3/16
[52] U.S. Cl. .......................... 330/255; 330/300
[58] Field of Search .................. 330/253, 255, 330/261, 267, 300

[56] References Cited

U.S. PATENT DOCUMENTS

| | | | |
|---|---|---|---|
| 4,379,267 | 4/1983 | Young | 330/253 |
| 5,212,455 | 5/1993 | Pernici et al. | 330/253 |
| 5,285,170 | 2/1994 | Stockstad et al. | 330/255 |

OTHER PUBLICATIONS

National Semiconductor Corp., "LMC6482 CMOS Dual Rail-To-Rail Input and Output Operational Amplifier", Apr. 1993, pp. 1–20 (whole pamphlet).

Frank Goodenough, Electronic Design, "Rail-To-Rail OP Amps Use Depletion-Mode PMOSFETs", Apr. 16, 1992, pp. 127–129.

Primary Examiner—Steven Mottola
Attorney, Agent, or Firm—Rennie William Dover; Robert D. Atkins

[57] ABSTRACT

Low voltage operational amplifier (10) operates in a voltage range of one to eight volts over a temperature range of 0° to 70° centigrade. Op amp input stage (12) uses N-channel depletion-mode MOSFETs to provide amplification of the differential input and maintain constant transconductance. Source follower MOSFET (13) provides unity gain in transferring the AC signal, STAGE-1 OUTPUT, to the base of current sinking transistor (18). Sink control circuit (14) and source control circuit (22) generate the base drive currents for transistors (18) and (24). The signal at the output of MOSFET (13) either causes the sink transistor (18) to sink current or the signal to be transposed by means of a translinear loop (16) and causes the source transistor (24) to source current.

20 Claims, 5 Drawing Sheets

LOW VOLTAGE OPERATIONAL AMPLIFIER AND METHOD

BACKGROUND OF THE INVENTION

The present invention relates in general to integrated circuit design and, more particularly, to monolithic operational amplifiers having a differential amplifier input stage that employs depletion mode Metal Oxide Semiconductor Field Effect Transistor (MOSFET) devices for attaining rail-to-rail input capability.

The industry trend for electronic systems which encompass operational amplifiers is toward lower operating voltages supplied from battery sources. Thus, amplifiers are used in applications requiring low voltage single supply operations in addition to traditional op amp application such as high input impedance, low input offset voltage, low noise, high bandwidth, high speed and sufficient output drive capabilities. Different manufacturing processes for integrated circuits have allowed techniques for differential input stages such as darlington PNP transistors and P-channel depletion-mode MOSFETS, aimed at satisfying the mentioned criteria for input stages of op amps. Amplifier output stages have used techniques involving combinations of transistors that include NPN, PNP and MOSFETs, aimed at low crossover distortion, large output voltage swings including rail to rail performance, excellent phase and gain margins, low output impedance and symmetrical source and sink capabilities.

Although the various types of input stages operate from a single supply voltage source, the low voltage limit for amplifier operation differs for each type of input stage and each integrated circuit manufacturing process. Present input stage designs for op amps exhibit voltage operation limits that hinder applications in products powered by batteries having an end of life near one volt. For example, an op amp using multiple bipolar transistors for compensating temperature effects and current paths have low operating voltage limitations imposed by standard transistor base to emitter voltage drops.

Hence, a need exists for a versatile operational amplifier that can be used in a variety of applications powered from battery sources, especially low voltage applications that do not diminish the characteristics of an operational amplifier. A need exists for an op amp input stage that provides high input impedance and a low input offset voltage. A need exists for an op amp that minimizes transistors in the signal path for providing high speed and high bandwidth and still have both input and output rail to rail capabilities.

DETAILED DESCRIPTION OF THE DRAWINGS

Figure 1:
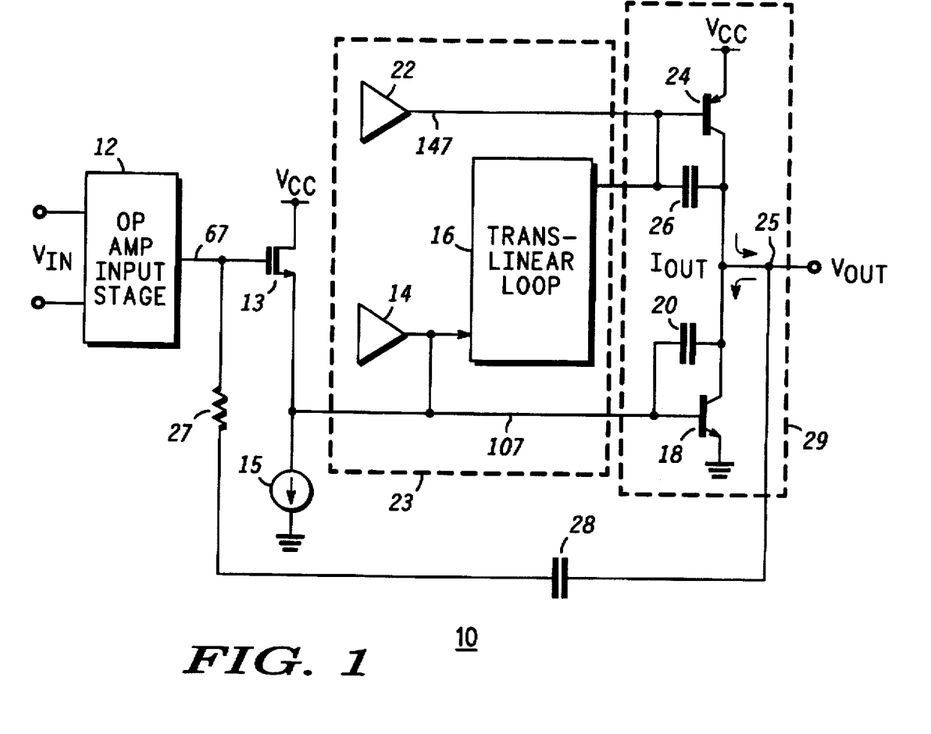
FIG. 1 is a block diagram of an operational amplifier, in accordance with a preferred embodiment of the present invention.

The block diagram for low voltage operational amplifier 10 is shown in FIG. 1. The differential input signal $V_{IN}$ is applied across the two inputs to op amp input stage 12. Terminal 67 of op amp input stage 12 is coupled to the gate of MOSFET 13. A MOSFET device with a drain terminal, source terminal, and gate terminal is a current conducting transistor with a first current terminal, a second current terminal, and a control terminal. Note that MOSFETs or other equivalents can be used where appropriate instead of bipolar transistors in the following descriptions. The drain of MOSFET 13 is coupled to power supply conductor $V_{CC}$ operating at a positive power supply, such as one volt. The negative supply for operational amplifier 10 is shown in the figures and described throughout as ground reference. The source of MOSFET 13 is coupled to the input of sink control circuit 14 and to the first terminal of current sink 15, sinking approximately twenty-five microamps. The bulk of MOSFET 13 (not shown) is coupled to a voltage reference (not shown). The second terminal of current sink 15 is coupled to ground reference. Terminal 107 of sink control circuit 14 is coupled to a first input of translinear loop 16 and to the base of NPN transistor 18. Capacitor 20 is coupled between the base and collector of transistor 18 and in the preferred embodiment has a capacitance of approximately eight picofarads. An NPN transistor or a PNP transistor with an emitter terminal, collector terminal, and base terminal is a current conducting transistor with a first current terminal, a second current terminal, and a control terminal. The emitter of transistor 18 is coupled to ground reference while the collector of transistor 18 is coupled to terminal 25 for providing the output signal, $V_{OUT}$.

Terminal 147 of source control circuit 22 in FIG. 1 is coupled to the output of translinear loop 16 and to the base of PNP transistor 24. Capacitor 26 is coupled between the base and collector of transistor 24 and in the preferred embodiment has a capacitance of approximately eight picofarads. The emitter of transistor 24 is coupled to operating potential $V_{CC}$. The collector of transistor 24 is coupled to terminal 25 for providing signal $V_{OUT}$ as the output driver stage output. Capacitor 28, selected at approximately twenty picofarads, and resistor 27, selected at about 1.4 kilohms, are serially coupled between terminal 25 and terminal 67 of op amp input stage 12.

Low voltage operational amplifier 10 has two stages of amplification. The output of op amp input stage 12 comprises an amplified differential input signal as the first stage of amplification and output driver stage 29 provides the second stage of amplification. MOSFET 13 is connected as an N-channel depletion-mode source follower MOSFET and processed to have a negative threshold voltage. In a depletion-mode source follower, the voltage potential imposed at the gate terminal is passed to the source terminal. The MOSFET device does not change or amplify the input signal and is therefore providing unity gain in transferring the received output from op amp input stage 12. MOSFET 13 provides a high input impedance inherent in MOSFET devices. The high input impedance is based on the isolation of the gate terminal from current paths, either to ground reference or to operating potential $V_{CC}$, due to dielectric oxides formed in processing MOSFET devices.

Referring to FIG. 1, sink control circuit 14 generates the base current drive for transistor 18 that controls low voltage operational amplifier 10 current sinking capabilities. Low voltage operational amplifier 10 has a $V_{CC}$ operating range of eight volts to one volt. At an operating potential $V_{CC}$ of three volts, the current sinking capability of transistor 18 is fifty milliamps. Source control circuit 22 generates the base current drive for transistor 24 that controls low voltage operational amplifier 10 current sourcing capabilities. At an operating potential $V_{CC}$ of three volts, the current sourcing capability of transistor 24 is fifty milliamps. When the signal $V_{IN}$ is amplified by op amp input stage 12, the signal to translinear loop 16 at terminal 107 is the transferred output of the signal at terminal 67. Thus, based on the input signal $V_{IN}$ to op amp input stage 12, translinear loop 16 selects whether sink control circuit 14 is operative and low voltage operational amplifier 10 is sinking current through transistor 18 or source control circuit 22 is operative and low voltage operational amplifier 10 is sourcing current through transistor 24.

Referring to FIG. 1, low voltage operational amplifier 10, with two stages of amplification, has two frequency poles. The function of resistor 27 and capacitor 28 is to move one frequency pole higher than the bandwidth of low voltage operational amplifier 10 and cause the other dominant frequency pole to move lower in frequency. The purpose of this pole splitting technique is to ensure amplifier stability. That is, by moving the second pole out beyond the unity gain point sufficient phase margin is achieved such that the phase shift is not one hundred and eighty degrees at the unity gain point, and low voltage operational amplifier 10 is prevented from oscillating.

Figure 2:
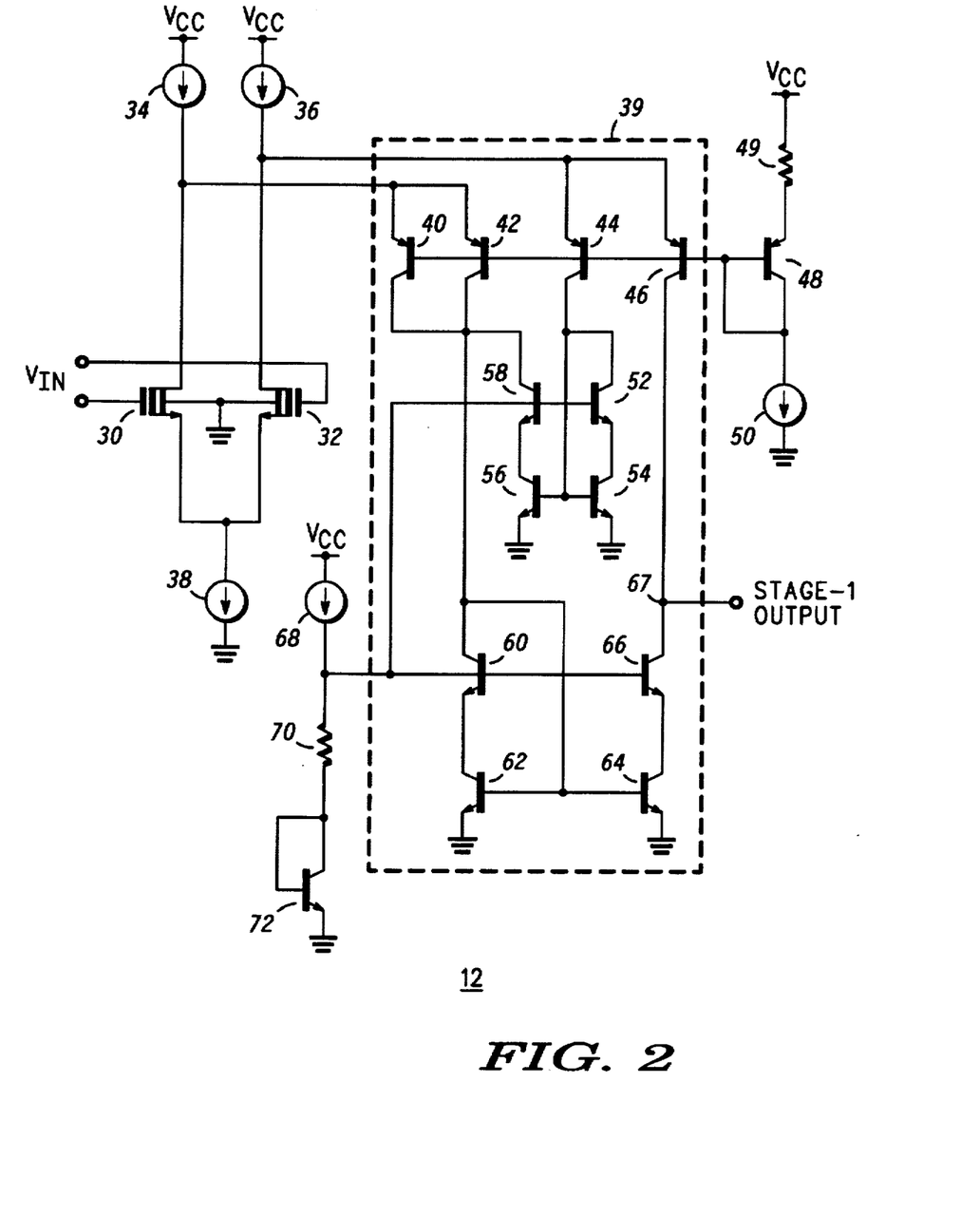
FIG. 2 is a schematic diagram showing a preferred embodiment of an input stage for the low voltage operational amplifier shown in FIG. 1.

FIG. 2 shows a schematic of a preferred embodiment of op amp input stage 12 suitable for use with the op amp shown in FIG. 1. The first stage of amplification in low voltage operational amplifier 10 is accomplished by op amp input stage 12. Signal $V_{IN}$ is the differential input coupled across the gates of N-channel depletion-mode Metal Oxide Semiconductor Field Effect Transistors (MOSFETs) 30 and 32. The drain of MOSFET 30 is coupled to one terminal of current source 34, supplying approximately eighty microamps of current. The drain of MOSFET 32 is coupled to one terminal of current source 36, supplying approximately eighty microamps of current. The second terminals for both current sources 34 and 36 are coupled to operating potential $V_{CC}$. Both source terminals of MOSFETS 30 and 32 are coupled to one terminal of current sink 38, sinking approximately forty microamps. The other terminal of current sink 38 is coupled to ground reference. The bulk, or well, terminals for both MOSFET 30 and MOSFET 32 are coupled to ground reference.

The differential pair of MOSFETS 30 and 32 in FIG. 2 that receive the input signal $V_{IN}$ provide two outputs from the drain terminals of MOSFETS 30 and 32, supplied as Alternating Current (AC) signal inputs to current bias circuit 39. The function of current bias circuit 39 is to provide equal loads on the two inputs coupled from the drain terminals of MOSFETS 30 and 32, match source and sink current capabilities at output terminal 67, provide a high impedance at output terminal 67, and perform a differential to single ended conversion of the input signal $V_{IN}$.

Transistors 40, 42, 44, 46, and 48 are PNP type with common transistor base terminals coupled to the collector of transistor 48 in a preferred embodiment. Current sink 50, sinking approximately twenty microamps, has a first terminal coupled to the common base and collector terminals of transistor 48. The second terminal of current sink 50 is coupled to ground reference. The emitters of transistors 40 and 42 are coupled to the drain of MOSFET 30. The emitters of transistors 44 and 46 are coupled to the drain of MOSFET 32. The emitter of transistor 48 is coupled to one terminal of resistor 49, selected at approximately 7.5 kilohms, and the second terminal of resistor 49 is coupled to operating potential $V_{CC}$.

Transistors 52, 54, 56, 58, 60, 62, 64, 66, and 72 are NPN type in a preferred embodiment of op amp input stage 12 in FIG. 2. The common collectors of transistors 44 and 52 couple to the common bases of transistors 54 and 56. Common collectors of transistors 40, 42, 58, and 60, are coupled to the common bases of transistors 62 and 64. The emitter of transistor 52 is coupled to the collector of transistor 54. The collector of transistor 56 is coupled to the emitter of transistor 58. Emitters of transistors 54 and 56 are coupled to ground reference. The emitter of transistor 60 is coupled to the collector of transistor 62. The collector of transistor 64 is coupled to the emitter of transistor 66. The emitters of transistors 62 and 64 are coupled to ground reference. The common base terminals of transistors 52, 58, 60, and 66 are coupled to one terminal of current source 68, which sources twenty microamps, and to one terminal of a nine kilohm resistor 70. The second terminal of current source 68 is coupled to operating potential $V_{CC}$. The second terminal of resistor 70 is coupled to the common collector and base of transistor 72. The emitter of transistor 72 is coupled to ground reference. The common collectors of transistors 46 and 66 are coupled to output terminal 67 for providing signal STAGE-1 OUTPUT as the op amp input stage output. This completes the connections for op amp input stage 12.

As one feature of the present invention, op amp input stage 12 uses N-channel depletion-mode MOSFETS 30 and 32 to swing rail to rail and exhibit minimal transconductance changes, whether gates are at ground, operating supply or half supply. Transconductance is measured as the change in MOSFET drain current for a given change in MOSFET gate-to-source voltage. Bandwidth of the amplifier is proportional to the transconductance. MOSFET 13 found in FIG. 1 and MOSFETS 30 and 32 of op amp input stage 12 are N-channel depletion-mode devices built on a silicon substrate having four terminals represented as gate, drain, source, and bulk. A processing mask layer defines the region for implanting N-type doping material, such as arsenic, into the silicon to form source and drain regions. The MOSFET gate region is also defined by a processing mask layer such that the gate conductor and gate oxide physically separate the source and drain regions. N-channel source and drain regions are confined within a well region for receiving a p-type material implant, such as boron. Low resistance conducting materials, such as aluminum metal, provide electrical connections to the gate terminal, source terminal, drain terminal, and the well terminal, or bulk.

Op amp input stage 12 in FIG. 2 accepts small signal differential inputs and accurately provides amplification. N-channel depletion-mode MOSFETS 30 and 32 continually operate in the saturation mode over the voltage range of input signal $V_{IN}$ and over the range of operating potential $V_{CC}$. Since MOSFET devices operate in the saturation region when the device drain voltage is greater than the difference of device gate voltage and threshold voltage, device threshold voltage becomes an important MOSFET parameter. For depletion-mode MOSFETS 13, 30 and 32 threshold voltage is a measured gate to source voltage at which drain-to-source current conduction is terminated.

The threshold voltage for an N-channel device fabricated on a silicon wafer is defined as the gate voltage required to overcome four particular physical processing fabrication effects to eliminate the drain-to-source conduction channel and terminate current flow. The first and second threshold effects are based on the flat-band voltage, defined as the voltage potential applied at the gate to overcome the work function and the charges under the gate at the silicon-silicon dioxide interface. Work function potential is based on the difference of electron energies at the Fermi level in the gate material and in the semiconductor material. Charges at the silicon-silicon dioxide interface are dependent on crystalline orientation and integrated circuit processing. The third and fourth threshold voltage effects for a MOSFET are attributed to the voltage potential required to form a surface inversion layer. The N-type conduction channel layer induced from source to drain by an electric field applied at the gate conductor depends on the concentration of impurities in the bulk material.

The threshold voltage term for an N-channel depletion-mode MOSFET is based on four terms directly related to processing during the manufacture of integrated circuits, such as wafer starting material, type of conducting gate material, impurities in the silicon at the gate oxide interface, and doping concentrations of the P-well bulk region. A processing flow step, known as threshold adjust implant, allows the N-channel MOSFET device to be altered from enhancement-mode to depletion-mode by imposing heavier N-type dose implants in the gate region. Depletion-mode MOSFETS 30 and 32 are processed with a negative threshold voltage. Even with the gate at ground reference, a MOSFET depletion-mode device with a negative threshold value has established an inversion layer for a current conduction path from the drain-to-source terminals.

With the gates of depletion-mode MOSFETS 30 or 32 at ground reference, the devices are saturated and operating in the normal common mode range with minimal body effect. N-channel MOSFETs are desirable because of the high transconductance per device area as processed on a silicon wafer. As the gate voltage potential of MOSFETS 30 and 32 rise above ground reference, the source terminals of MOSFETS 30 and 32 follow the gate voltage positive. With the bulk terminals of MOSFETS 30 and 32 coupled to ground reference, source terminal voltage potentials above the bulk terminal voltages cause the channel conductance to be modulated, which is body effect. An increase in source to bulk voltage dynamically shifts the threshold voltage of N-channel depletion-mode MOSFET device from a negative value, induced by implant doping in the bulk, toward a positive value. With a positive threshold value, the common mode range of the MOSFET device shifts toward sensing at the positive supply rail. Heavy P-type well doping increases the body effect of N-channel depletion-mode MOSFETS 30 and 32 to maintain operation of both devices in the saturation region while operating at the positive rail. Therefore, body effect aids the N-channel depletion-mode MOSFET device by modulating the threshold voltage and keeping the MOSFET device operating in the saturation region.

An alternate embodiment of op amp input stage 12 involves replacing the four transistors 52, 54, 56, and 58 by two NPN transistors arranged as a current mirror and replacing the four transistors 60, 62, 64, and 66 by two NPN transistors also arranged as a current mirror. In referring to FIG. 2, the alternate embodiment in effect places a wire short from collector to emitter for each of transistors 52, 58, 60, and 66 and then removing those transistors from the schematic. In the alternate embodiment, the voltage reference provided by current source 68, resistor 70, and transistor 72 of op amp input stage 12 is removed.

Referring to op amp input stage 12 shown in FIG. 2 with the alternate embodiment just described, the current flowing in the collector of transistor 40 is $I_{ce}$, approximately thirty microamps. An equivalent current $I_{ce}$ also flows in each of transistors 42, 44, and 46 when the op amp inputs are in common mode. A $2I_{be}$ portion of the $I_{ce}$ collector current in transistor 44 is used to supply base currents to transistors 54 and 56, leaving $(I_{ce}-2I_{be})$ current in the collector of transistor 54. The current mirror of transistors 54 and 56 implies that an $(I_{ce}-2I_{be})$ current is also in the collector of transistor 56. With transistors 40 and 42 each supplying equal $I_{ce}$ currents, and current in the collector of transistor 56 at $(I_{ce}-2I_{be})$, the collector current in transistor 62 is $I_{ce}$ after subtracting the current $2I_{be}$ to the bases of transistors 62 and 64. The current mirror of transistors 62 and 64 implies that an equivalent $I_{ce}$ collector current of transistor 62 is collector current in transistor 64, respectively matching the $I_{ce}$ current supplied by transistor 46. Thus, source and sink current to the STAGE-1 OUTPUT signal have matching output capabilities through sourcing current in transistor 46 and sinking current in transistor 64.

The alternate embodiment in the simplified form just described was enhanced to the preferred embodiment shown in FIG. 2 for the purpose of improving the effective output impedance for the signal STAGE-1 OUTPUT at output terminal 67. The addition of cascode transistor 66 in series with transistor 64 increases the output impedance at output terminal 67. Transistor 60 is added to balance transistor 66. The addition of transistors 52 and 58 to transistors 54 and 56 form another cascode current mirror for matching and canceling $I_{be}$ currents to the cascode current mirror formed by transistors 60, 62, 64 and 66.

Op amp input stage 12 as shown in FIG. 2 provides the first stage of signal $V_{IN}$ amplification based on the saturation currents of MOSFETS 30 and 32 obeying a square law relationship to the voltage applied at the gate terminal. Current bias circuit 39, with terminal 67 supplying the STAGE-1 OUTPUT signal, is a high impedance output considering connection to the common collectors of transistors 46 and 66. Current bias circuit 39 also matches source and sink current capabilities of transistors 46 and 66 in supplying the STAGE-1 OUTPUT signal. As described above, transistors 52, 54, 56, and 58 are coupled together in a manner allowing $I_{be}$ cancellation such that transistors 46 and 66 match source and sink current capabilities in supplying the STAGE-1 OUTPUT signal at terminal 67.

Referring to FIG. 2, the base coupled to the collector of transistor 48 sets a $V_{be}$ diode voltage reference and, when added to the approximate twenty microamps of current through resistor 49 from current sink 50, sets a voltage approximately 0.75 volts below operating potential $V_{CC}$. Transistors 40, 42, 44, and 46 are kept in the active operating region by the 0.75 volts supplied as the transistor base reference voltage below operating potential $V_{CC}$. Likewise, an approximate 0.75 volt potential above ground reference voltage is used to bias transistors 52, 58, 60, and 66 in their active regions. The 0.75 volt potential is the combination of twenty microamps of current from current source 68, through nine kilohm resistor 70 in addition to the $V_{be}$ voltage drop of transistor 72.

Figure 3:
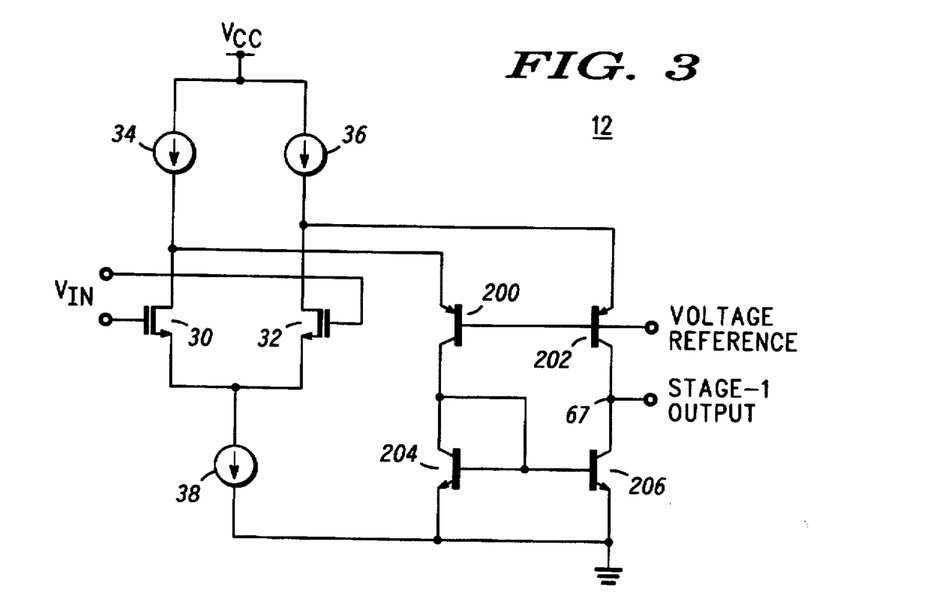
FIG. 3 is a schematic diagram showing an alternate embodiment of an input stage for the low voltage operational amplifier shown in FIG. 1.

FIG. 3 shows another alternate embodiment of op amp input stage 12. MOSFETs 30 and 32 are coupled to current sources 34 and 36 and to current sink 38 as discussed above. The differential pair of MOSFETS 30 and 32 that receive the input signal $V_{IN}$ provide two outputs from drain terminals of MOSFETS 30 and 32. The output from the drain of MOSFET 30 is coupled to the emitter of PNP transistor 200. The output from the drain of MOSFET 32 is coupled to the emitter of PNP transistor 202. Common bases of transistors 200 and 202 are coupled to receive a voltage reference. The common bases of NPN transistors 204 and 206 are coupled to the collector of transistor 204. The collector of transistor 200 is coupled to the collector of transistor 204. The collector of transistor 202 is coupled to terminal 67 for providing the output signal STAGE-1 OUTPUT. The collector of transistor 206 is coupled to terminal 67. The emitters of transistors 204 and 206 are coupled to ground reference.

Again referring to FIG. 3, the differential pair of MOSFETs 30 and 32 receive the input signal $V_{IN}$ and along with transistors 200, 202, 204, and 206 perform a differential to single ended conversion of the input signal. However, transistors 202 and 206 do not match source and sink current capabilities or provide as high an output impedance at terminal 67 as the preferred embodiment shown in FIG. 2.

Figure 4:
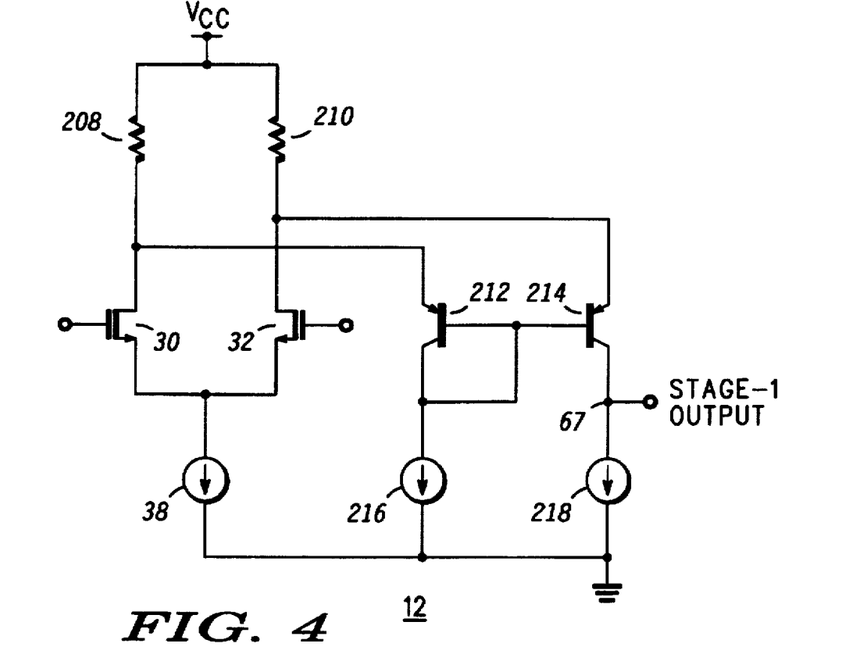
FIG. 4 is a schematic diagram showing another alternate embodiment of an input stage for the low voltage operational amplifier shown in FIG. 1.

FIG. 4 is also another alternate embodiment of op amp input stage 12. MOSFET 30 is coupled to resistor 208 and MOSFET 32 is coupled to resistor 210. The second terminals of resistors 208 and 210 are coupled to operating potential $V_{CC}$. The differential pair of MOSFETS 30 and 32 that receive the input signal $V_{IN}$ provide outputs from the drain terminals of MOSFETS 30 and 32. The output from the drain of MOSFET 30 is coupled to the emitter of PNP transistor 212. The output from the drain of MOSFET 32 is coupled to the emitter of PNP transistor 214. Common bases of transistors 212 and 214 are coupled to the collector of transistor 212. The first terminal of current sink 216 is coupled to the collector of transistor 212. The collector of transistor 214 is coupled to the output terminal 67 for providing the signal STAGE-1 OUTPUT. The first terminal of current sink 218 is coupled to terminal 67. The second terminals of current sink 216 and 218 are coupled to ground reference. Again, the alternate embodiment shown in FIG. 4 does not match source and sink current capabilities or provide as high an output impedance at terminal 67 as the preferred embodiment shown in FIG. 2.

Figure 5:
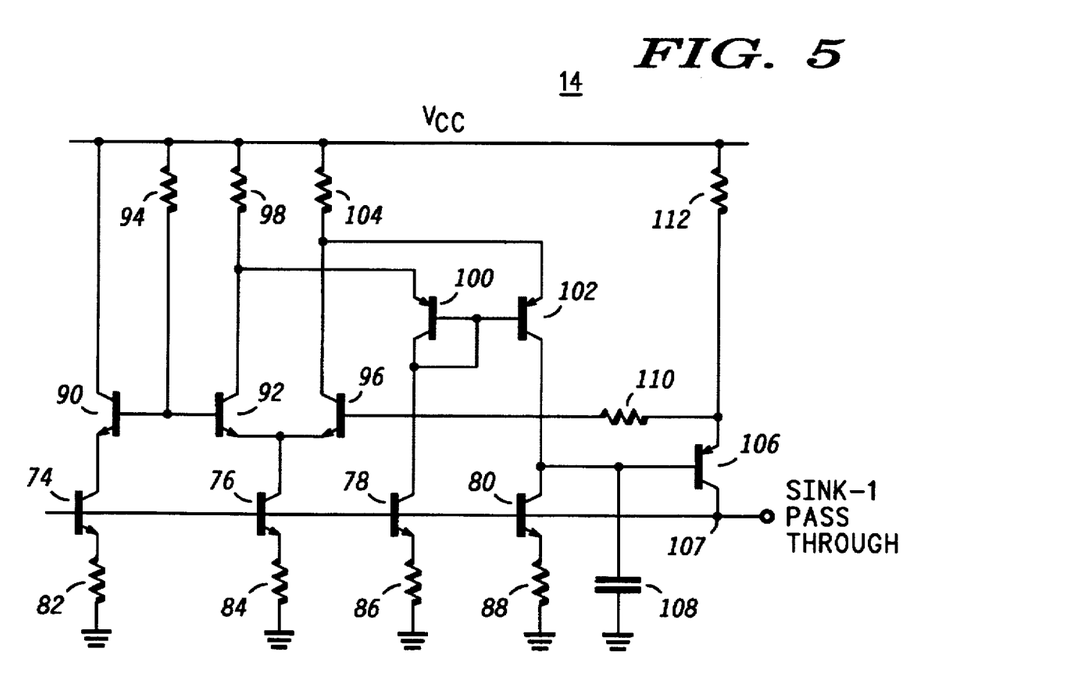
FIG. 5 is a schematic diagram showing an output sink transistor base current generating stage for the operational amplifier shown in FIG. 1.

FIG. 5 shows a schematic diagram of sink control circuit 14 suitable for use in low voltage operational amplifier 10 of FIG. 1. Common bases of NPN transistors 74, 76, 78, and 80, are coupled to receive as input to sink control circuit 14 the output from the source of MOSFET 13, as shown in FIG. 1. The emitter of transistor 74 is coupled to the first terminal of resistor 82, selected at approximately three ohms in the preferred embodiment. The emitter of transistor 76 is coupled to the first terminal of resistor 84, selected at approximately one and one half kilohms. The emitter of transistor 78 is coupled to the first terminal of resistor 86, selected at approximately one and one half kilohms. The emitter of transistor 80 is coupled to the first terminal of resistor 88, selected at approximately one and one half kilohms. The second terminals for resistors 82, 84, 86, and 88, are coupled to ground reference.

Common bases of NPN transistors 90 and 92 in FIG. 5 are coupled to the first terminal of resistor 94, selected at approximately twenty five kilohms. The emitter of transistor 90 is coupled to the collector of transistor 74. Common emitters of transistors 92 and 96 are coupled to the collector of transistor 76. The collector of transistor 92 is coupled to the emitter of PNP transistor 100 and to the first terminal of resistor 98, selected at approximately four kilohms. The collector of NPN transistor 96 is coupled to the emitter of PNP transistor 102 and to the first terminal of resistor 104, selected at approximately four kilohms. Common bases of transistors 100 and 102 are coupled to the collector of transistor 100 and to the collector of transistor 78. The collector of transistor 102 couples to the collector of transistor 80 and to the base of PNP transistor 106. The first terminal of capacitor 108 selected at approximately five picofarads capacitance, couples to the base of transistor 106. The second terminal of capacitor 108 is coupled to ground reference. The collector of transistor 106 is coupled to terminal 107, which provides the signal SINK-1 PASS THROUGH. The emitter of transistor 106 is coupled to the first terminal of resistor 110, selected at approximately twenty five kilohms, and to the first terminal of resistor 112, selected at approximately one kilohm. The second terminal of resistor 110 is coupled to the base of transistor 96. The second terminal of resistors 94, 98, 104, and 112, and the collector of transistor 90 are coupled to the operating potential $V_{CC}$.

The function of sink control circuit 14 in FIG. 5 is to supply the proper base drive current required by output transistor 18, shown in FIG. 1, for sinking a current such as $I_{out}$ at the output of low voltage operational amplifier 10. The emitter geometry of transistor 18 in FIG. 1 is sized at $N_T$ times the emitter geometry of transistor 74 in FIG. 5. For this preferred embodiment, the $N_T$ transistor multiplier for ratioing is approximately twenty five. Thus, output transistor 18 has a collector current $N_T$ times greater than the collector current of transistor 74. Transistor 90 is sized with the same or similar emitter geometry as transistor 74, and therefore conducts the same or similar collector current $I_{out}/N_T$. The base current of transistor 90 is $I_{out}/(N_T B)$, where B is the transistor current gain defined as the ratio of transistor collector current divided by transistor base current. Transistors 92 and 96 form a differential unity gain amplifier with the base of transistor 92 sensing the voltage drop resulting from the $I_{out}/(N_T B)$ current in resistor 94.

Thus, transistor 90 and resistor 94 have converted a proportionately smaller current than the $I_{out}$ found in transistor 18 into a voltage across resistor 94 which becomes one input to the differential unity gain amplifier. The voltage at the base of transistor 92 is the current through resistor 94 multiplied by the resistance $R_{94}$ of resistor 94, for a voltage of $(I_{out} \cdot R_{94})/(N_T B)$. Both inputs to the differential unity gain amplifier have matching voltage potentials. The other input to the differential unity gain amplifier is applied at the base of transistor 96. The voltage at the base of transistor 96 results from current $I_C$ flowing through resistor 112, having a resistance $R_{112}$. With both inputs to the differential unity gain amplifier having matching voltage potentials, the result is $(I_C \cdot R_{112}) = (I_{out} \cdot R_{94})/(N_T B)$. Solving for the current $I_C$ results in $(I_{out} \cdot N_R)/(N_T B)$ where $N_R$ is the ratio of resistance values for resistor 94 and resistor 112, a value of $R_{94}/R_{112}$. The current $I_C$ through resistor 112 essentially becomes the emitter-to-collector current of transistor 106. By selecting the value $N_R$ to match $N_T$, the current $I_C$ has the value of $I_{out}/B$. Thus, by matching the ratio of two transistors, transistor 18 and transistor 74, to the ratio of two resistors, namely resistor 94 and resistor 112, the current $I_{out}/B$ through transistor 106 supplies the base current to sink transistor 18. With a base current of $I_{out}/B$ in transistor 18 as shown in FIG. 1, collector current for transistor 18 is $I_{out}$. The function of sink control circuit 14 in FIG. 5 is to supply the proper base drive current required by output transistor 18, shown in FIG. 1, for sinking current $I_{out}$ at the output of low voltage operational amplifier 10.

Thus, sink control circuit 14 accomplishes three transformation steps. The first step involves providing transistor emitter geometry ratios for transistor 18 and transistor 74 to generate a current of $I_{out}/(N_T \cdot B)$ in the base of transistor 90. In step two, sink control circuit 14 generates a voltage at inputs to differential unity gain amplifier dependent on the generated $I_{out}/(N_T \cdot B)$ current in resistor 94. The final step involves resistor ratioing such that transistor 106 in sink control circuit 14 generates a collector current $I_{out}/B$ in transistor 106 for supplying base drive current to output transistor 18 in low voltage operational amplifier 10. Such a base drive current for transistor 18 shown in FIG. 1 is dependent on both transistor and resistor ratioing and the voltage developed by differential unity gain amplifier found in sink control circuit 14 shown in FIG. 5. For this preferred embodiment, $N_T$ transistor ratioing is approximately twenty five and $N_R$ resistor ratioing is approximately twenty five.

In low voltage operational amplifier 10 in FIG. 1, amplification of the input signal $V_{IN}$ provides the signal STAGE-1 OUTPUT at terminal 67 as the op amp input stage 12 output, which MOSFET 13 passes directly to the base of transistor 18, causing a base-to-emitter voltage ($V_{be}$) change. The $V_{be}$ change causes transistor 18, sinking a current $I_{out}$, to modify the current and sink ($I_{out}+\Delta I_{out}$). Sink control circuit 14 responds to a $\Delta V_{be}$ at the base of transistor 18 and generates the additional base current for transistor 18 in accounting for $\Delta I_{out}$ collector current changes in sink transistor 18. Sink control circuit 14 supplies the base drive current through transistor 106 as required by output sink transistor 18 shown in FIG. 1 as low voltage operational amplifier 10 responds to changes to the input signal VIN.

Figure 6:
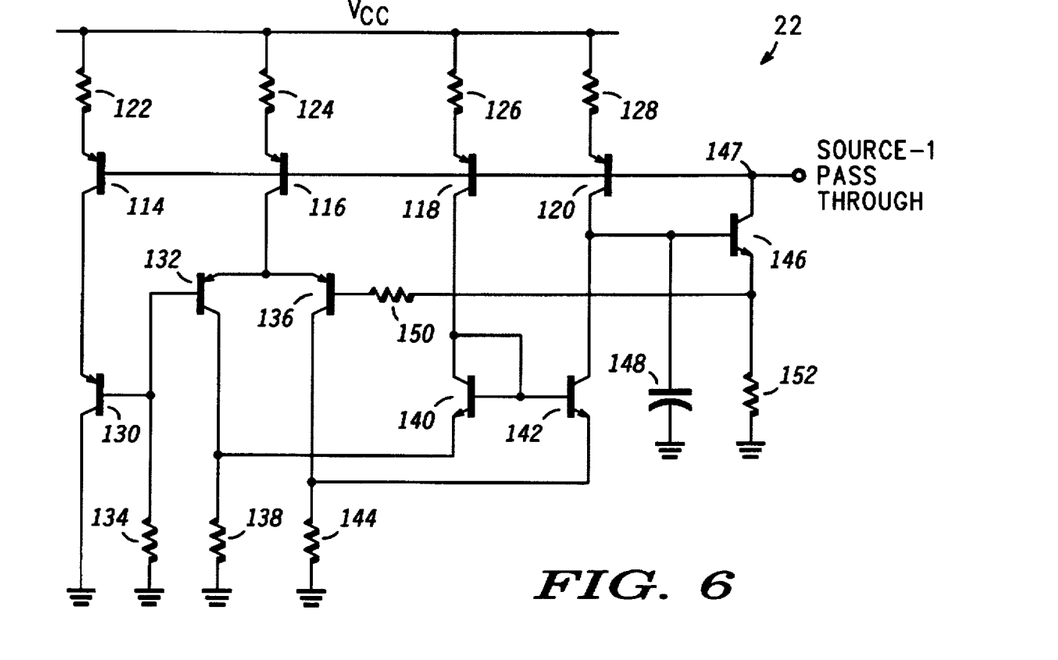
FIG. 6 is a schematic diagram showing an output source transistor base current generating stage for the operational amplifier shown in FIG. 1.

Source control circuit 22 as shown in FIG. 1 is shown in FIG. 6 as a preferred embodiment. Common bases of PNP transistors 114, 116, 118, and 120, are coupled to terminal 147 that provides the signal, SOURCE-1 PASS THROUGH. The emitter of transistor 114 is coupled to the first terminal of resistor 122, selected at approximately ten ohms. The emitter of transistor 116 is coupled to the first terminal of resistor 124, selected at approximately four kilohms. The emitter of transistor 118 is coupled to the first terminal of resistor 126, selected at approximately one kilohm. The emitter of transistor 120 is coupled to the first terminal of resistor 128, selected at approximately one kilohm. The second terminals for resistors 122, 124, 126, and 128 are coupled to operating potential $V_{CC}$.

Common bases of PNP transistors 130 and 132 are coupled to the first terminal of resistor 134, selected at approximately twenty five kilohms. The emitter of transistor 130 is coupled to the collector of transistor 114. Common emitters of transistors 132 and 136 are coupled to the collector of transistor 116. The collector of transistor 132 is coupled to the emitter of transistor 140 and to the first terminal of resistor 138, selected at approximately four kilohms. The collector of PNP transistor 136 is coupled to the emitter of transistor 142 and to the first terminal of resistor 144, selected at approximately four kilohms. Common bases of NPN transistors 140 and 142 are coupled to the collector of transistor 140 and to the collector of transistor 118. The collector of transistor 142 couples to the collector of transistor 120 and to the base of NPN transistor 146. Capacitor 148, selected at a capacitance of approximately ten picofarads, has the first terminal coupled to the base of transistor 146. The second terminal of capacitor 148 is coupled to ground reference. The collector of transistor 146 is coupled to terminal 147 providing the signal, SOURCE-1 PASS THROUGH. The emitter of transistor 146 is coupled to the first terminal of resistor 150, selected at twenty five kilohms, and to the first terminal of resistor 152, selected at approximately five hundred ohms. The second terminal of resistor 150 is coupled to the base of transistor 136. The second terminal of resistors 134, 138, 144, and 152, and the collector of transistor 130 are coupled to ground reference.

The function of source control circuit 22 in FIG. 6 is to supply the proper base drive current required by output transistor 24, shown in FIG. 1, for sourcing a current such as $I_{out}$ at the output of low voltage operational amplifier 10. The emitter geometry of transistor 24 in FIG. 1 is sized at $N_t$ times the emitter geometry of transistor 114 in FIG. 6. For this preferred embodiment, the $N_t$ transistor ratioing multiplier is approximately fifty. Thus, output transistor 24 has a collector current $N_t$ times greater than the collector current of transistor 114. Transistor 130 is sized with the same or similar emitter geometry as transistor 114, and therefore conducts the same or similar collector current $I_{out}/N_t$. The base current of transistor 130 is $I_{out}/(N_t \cdot B)$, where B is the transistor current gain defined as the ratio of transistor collector current divided by transistor base current. Transistors 132 and 136 form a differential unity gain amplifier with the base of transistor 132 sensing the voltage drop resulting from the $I_{out}/(N_t \cdot B)$ current in resistor 134.

Thus, transistor 130 and resistor 134 have converted a proportionately smaller current than the $I_{out}$ found in transistor 24 into a voltage across resistor 134 which becomes one input to the differential unity gain amplifier. Therefore, the voltage at the base of transistor 132 is the current through resistor 134 multiplied by the resistance $R_{134}$ of resistor 134, for a voltage of $(I_{out} \cdot R_{134})/(N_t \cdot B)$. Both inputs to the differential unity gain amplifier have matching voltage potentials. The other input to the differential unity gain amplifier is applied at the base of transistor 136. The voltage at the base of transistor 136 results from current $I_c$ flowing through resistor 152, having a resistance $R_{152}$. With both inputs to the differential unity gain amplifier have matching voltage potentials, the result is $(I_c \cdot R_{152})=(I_{out} \cdot R_{134})/(N_t \cdot B)$. Solving for the current $I_c$ results in $(I_{out} \cdot N_r)/(N_t \cdot B)$ where $N_r$ is the ratio of resistance values for resistor 134 and resistor 152, a value of $R_{134}/R_{152}$. The current $I_c$ through resistor 152 essentially becomes the collector-to-emitter current of transistor 146. By selecting the value $N_r$ to match $N_t$, the current $I_c$ has the value of $I_{out}/B$. Thus, by matching the ratio of two transistors, transistor 24 and transistor 114, to the ratio of two resistors, namely resistor 134 and resistor 152, the current $I_{out}/B$ through transistor 146 supplies the base current to source transistor 24. With a base current of $I_{out}/B$ in transistor 24 as shown in FIG. 1, collector current for transistor 24 is $I_{out}$. The function of source control circuit 22 in FIG. 6 is to supply the proper base drive current through transistor 146 as required by output transistor 24, shown in FIG. 1, for sourcing current $I_{out}$ at the output of low voltage operational amplifier 10.

Thus, source control circuit 22 accomplishes three transformation steps. The first step involves providing transistor emitter geometry ratios for transistor 24 and transistor 114 to generate a current of $I_{out}/(N_t \cdot B)$ in the base of transistor 130. In step two, source control circuit 22 generates a voltage at inputs to differential unity gain amplifier dependent on the generated $I_{out}/(N_t \cdot B)$ current in resistor 134. The final step involves resistor ratioing of resistors 152 and 134 such that transistor 146 in source control circuit 22 generates a collector current $I_{out}/B$ for supplying base drive current to output transistor 24 in low voltage operational amplifier 10.

Such a base drive current for transistor 24 shown in FIG. 1 is dependent on both transistor and resistor ratioing and the voltage developed by differential unity gain amplifier found in source control circuit 22 shown in FIG. 6. For this preferred embodiment, $N_t$ transistor ratioing is approximately fifty and $N_r$ resistor ratioing is approximately fifty.

In low voltage operational amplifier 10 in FIG. 1, amplification of the input signal $V_{IN}$ provides the signal STAGE-1 OUTPUT as the op amp input stage 12 output, which MOSFET 13 passes directly to the base of transistor 18, causing a base-to-emitter voltage ($V_{be}$) change. Translinear loop 16 passes the same magnitude $V_{be}$ voltage change found at the base of transistor 18 onto the base of transistor 24. However, the $V_{be}$ voltage change has the opposite sign, i.e., if $V_{be}$ for transistor 18 is increasing the $V_{be}$ for transistor 24 is decreasing. The $V_{be}$ change causes transistor 24, sourcing a current $I_{out}$, to modify the current and source ($I_{out}$–$\Delta I_{out}$). Source control circuit 22 supplies the base drive current required by output source transistor 24 shown in FIG. 1 as low voltage operational amplifier 10 responds to changes to the input signal VIN.

Figure 7:
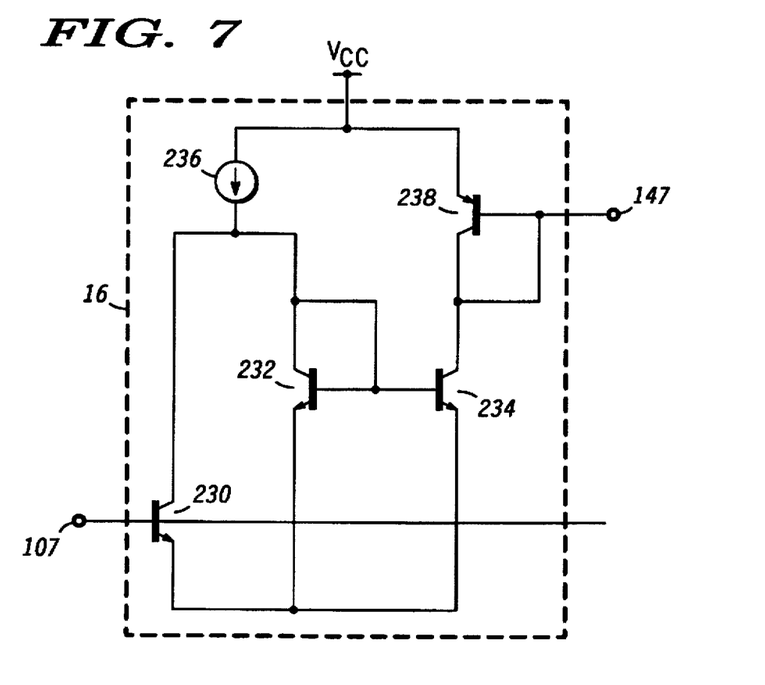
FIG. 7 is a schematic diagram showing an alternate embodiment of a low voltage translinear loop for the operational amplifier shown in FIG. 1.

FIG. 7 shows an embodiment of simplified translinear loop 16. The base of NPN transistor 230 is coupled to terminal 107. The common collectors of NPN transistors 230 and 232 are coupled to the common bases of NPN transistors 232 and 234. The common emitters of transistors 230, 232, and 234 are coupled to ground reference. Current source 236 is coupled to the collector of transistor 232. The second terminal of current source 236 is coupled to operating potential $V_{CC}$. The base and collector of PNP transistor 238 are coupled to the collector of transistor 234. The emitter of transistor 238 is coupled to operating potential $V_{CC}$. The base and collector of PNP transistor 238 are coupled to output terminal 147. Terminal 147 is coupled to the base of source transistor 24 of output driver stage 29 (see FIG. 1).

Still referring to FIG. 7, as an example, the simplified embodiment of translinear loop 16 receives a positive voltage change at terminal 107 which modifies the base-to-emitter voltage $V_{be}$ of transistor 230. The same $+\Delta V_{be}$ that causes transistor 18 in output driver stage 29 (see FIG. 1) to increase in conductivity also causes transistor 230 to increase conductivity and shunt current from diode connected transistor 232. Thus, current source 236 supplies current that transistor 230 proportionately steers into the collector terminal of transistor 230 or diverts into transistor 232 as determined by the $\Delta V_{be}$ of transistor 230 from the received signal at terminal 107. Transistor 234 forms a current mirror transistor with transistor 232. The $+\Delta V_{be}$ at transistor 230 causes a decreasing current conducted by transistor 232, and the current mirror causes a decreasing current conducted by transistor 234. Decreased current in transistor 234 means decreased current in diode connected transistor 238, causing a decreased $V_{be}$ in transistor 238. The same decreasing $V_{be}$ seen at the base of transistor 238 is seen at the base of output source transistor 24 in output driver stage 29 (see FIG. 1). Therefore, an increasing $+\Delta V_{be}$ for a higher conductivity in output sink transistor 18 (see FIG. 1) is translated into an equivalent decreasing $-\Delta V_{be}$ for a lower conductivity in output source transistor 24 (see FIG. 1) by translinear loop 16.

When the simplified embodiment of translinear loop 16 shown in FIG. 7 receives a negative voltage change at terminal 107, the base-to-emitter voltage $V_{be}$ of transistor 230 is modified. The same $-\Delta V_{be}$ that causes transistor 18 in output driver stage 29 (see FIG. 1) to decrease conductivity also causes transistor 230 to decrease conductivity, which increases current to diode connected transistor 232. Thus, current source 236 supplies current that transistor 230 proportionately steers into the collector terminal of transistor 230 or diverts into transistor 232 as determined by the $V_{be}$ change of transistor 230 caused by the received signal at terminal 107. Transistor 234 forms a current mirror transistor with transistor 232. The $-\Delta V_{be}$ at transistor 230 therefore causes an increase in current conducted by transistor 234. Increased current in transistor 234 means increased current in diode connected transistor 238, causing an increased $V_{be}$ in transistor 238. The same increasing $V_{be}$ seen at the base of transistor 238 is seen at the base of output source transistor 24 in output driver stage 29 (see FIG. 1). Therefore, a decreasing $V_{be}$ for a decreasing conductivity in output sink transistor 18 (see FIG. 1) is translated into an equivalent $+\Delta V_{be}$ for an increasing conductivity in output source transistor 24 (see FIG. 1) by translinear loop 16.

With reference to FIG. 7, quiescent currents for low voltage translinear loop 16 rely on relationships for sizing the geometry of a transistor. The emitter area of transistor 18 (see FIG. 1) is sized at $N_n$ times the emitter area of transistor 230. The emitter area of transistor 24 (see FIG. 1) is sized at $N_p$ times the emitter area of transistor 238. Also, the current mirror transistors are sized such that emitter geometry of transistor 234 is $M_n$ times the emitter geometry of transistor 232. Since the area of an emitter determines the current capacity for a transistor, the current 2I out of current source 236 and the selection of three variables $N_n$, $N_p$, and $M_n$ set the other currents in low voltage translinear loop 16. Thus, the quiescent current $I_Q$ in sink transistor 18 (see FIG. 1) is set by $I_Q=(N_n \cdot I)$ and the quiescent current $I_Q$ in source transistor 24 (see FIG. 1) is set by $I_Q=(M_n \cdot N_p \cdot I)$. Adding resistors in the coupling path of emitter terminal to ground reference for transistors 230, 232, and 234 or adding a resistor in the coupling path of emitter terminal for transistor 238 to operating potential $V_{CC}$ causes emitter degeneration and allows multiplier factors $N_n$, $N_p$, and $M_n$ to change.

Figure 8:
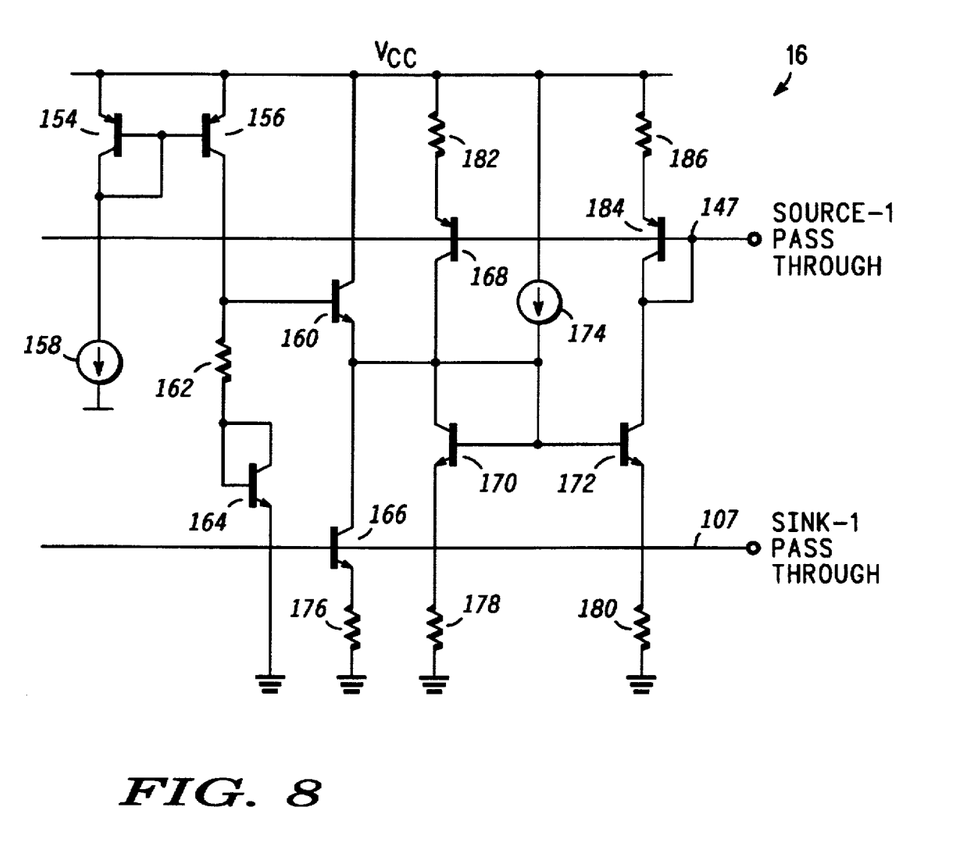
FIG. 8 is a schematic diagram showing a preferred embodiment of a low voltage translinear loop for selecting the source or sink capabilities of an output amplifier as shown in FIG. 1.

FIG. 8 shows the preferred embodiment of translinear loop 16 as mentioned in FIG. 1. Common bases of PNP transistors 154 and 156 are coupled to the collector of transistor 154 and to the first terminal of current sink 158, sinking approximately ten microamps of current. The collector of transistor 156 is coupled to the base of NPN transistor 160 and to the first terminal of resistor 162, selected at approximately thirty-three kilohms. The second terminal of resistor 162 couples to the base and collector of NPN transistor 164. The emitter of transistor 160 couples to the collector of NPN transistor 166. The base of transistor 166 couples to terminal 107 for receiving the signal SINK-1 PASS THROUGH. The emitter of transistor 160 couples to the collector of PNP transistor 168. The emitter of transistor 160 couples to the common bases of NPN transistors 170 and 172. The emitter of transistor 160 couples to the collector of transistor 170 and to the first terminal of current source 174, sourcing approximately one hundred and seventy five microamps. The emitter of transistor 166 couples to the first terminal of resistor 176, selected at approximately fifty ohms. The emitter of transistor 170 is coupled to the first terminal of resistor 178, selected at approximately one hundred ohms. The emitter of transistor 172 is coupled to the first terminal of resistor 180, selected at approximately twenty-five ohms. The emitter of transistor 168 is coupled to resistor 182, selected at approximately three-hundred ohms. The common collectors of transistors 172 and 184 are coupled to the base of PNP transistor 184 and coupled to terminal 147 for providing the signal SOURCE-1 PASS THROUGH. The emitter of transistor 184 is coupled to the first terminal of resistor 186, selected at approximately four-hundred ohms. The emitters of transistors 154 and 156 are coupled to operating potential $V_{CC}$. The collector of transistor 160 is coupled to operating potential $V_{CC}$. The second terminals of resistor 182 and 186 and the second terminal of current source 174 are coupled to operating potential $V_{CC}$. The second terminals of resistors 176, 178, and 180 are coupled to ground reference. The emitter of transistor 164 and the second terminal of current sink 158, are coupled to ground reference.

Translinear loop in FIG. 8 provides a fast output stage with high frequency response characteristics. In a manner similar to the already mentioned simplified embodiment of translinear loop 16, an increasing voltage signal SINK-1 PASS THROUGH at terminal 107 causes transistor 166 to shunt current away from diode connected transistor 170. Less current in transistor 170 also means less current in the current mirror device, transistor 172. The decrease in transistor 172 current means lower current in diode connected transistor 184, causing a lower $V_{be}$ voltage in transistor 184. The lower base-to-emitter voltage for transistor 184 is also seen as the $V_{be}$ for transistor 24 shown in FIG. 1. Thus, an AC signal modulating the base voltage of transistor 18 to a more positive potential causes transistor 18 to be more conductive, but translinear loop 16 causes transistor 24 to be less conductive. Translinear loop 16 transposes AC signals from the base of transistor 18 to the base of transistor 24 without providing signal voltage gain. Only op amp input stage 12 and output transistors 18 and 24, provide signal gain. A +$\Delta V_{be}$ across sink transistor 18 (see FIG. 1) due to signal SINK-1 PASS THROUGH at terminal 107 is translated to a matching −$\Delta V_{be}$ across source transistor 24 (see FIG. 1) by translinear loop 16.

In a manner similar to the already mentioned simplified embodiment of translinear loop 16, a decreasing voltage signal SINK-1 PASS THROUGH at terminal 107 causes transistor 166 to steer current to diode connected transistor 170. More current in transistor 170 also means more current in the current mirror device, transistor 172. The increase in transistor 172 current means higher current in diode connected transistor 184, causing a higher $V_{be}$ in transistor 184. The increased base-to-emitter voltage for transistor 184 is also seen as the $V_{be}$ for transistor 24 shown in FIG. 1. Thus, an AC signal modulating the base voltage of transistor 18 to a lower voltage potential causes transistor 18 to be less conductive, but translinear loop 16 causes transistor 24 to be more conductive. A −$\Delta V_{be}$ across sink transistor 18 (see FIG. 1) due to signal SINK-1 PASS THROUGH at terminal 107 is translated to a matching +$\Delta V_{be}$ across source transistor 24 (see FIG. 1) by translinear loop 16. Low voltage translinear loop 16 provides a low impedance path to output devices, thus ensuring no voltage gain to the base of sourcing transistor 24.

Sink control circuit 14 and source control circuit 22 in FIG. 1 provide important Direct Current (DC) generating functions in providing base current drive for the output transistors 18 and 24 in output driver stage 29. However, low voltage operational amplifier 10 frequency performance does not depend on sink control circuit 14 or source control circuit 22. Low voltage operational amplifier 10 frequency performance depends on the AC signal path from $V_{IN}$ of op amp input stage 12 to the STAGE-1 OUTPUT, through source follower MOSFET 13, directly to the base of output current sinking transistor 18. The AC signal path from the current sink side to the current source side follows the base of output current sinking transistor 18, through translinear loop 16, to the base of output current sourcing transistor 24.

Thus, the AC signal path bypasses the circuitry in sink control circuit 14 and source control circuit 22, allowing a higher frequency performance in low voltage operational amplifier 10. The bandwidth of low voltage operational amplifier 10 is five megahertz. Bias circuit 23 is comprised of sink control circuit 14, source control circuit 22, and translinear loop 16. A first bias output is generated at terminal 107 in accordance with the signal transferred across the source follower and the current generated by sink control circuit 14. A second bias output is generated at terminal 147 in accordance with the signal transferred by translinear loop 16 and the current generated by source control circuit 22.

By now it should be appreciated that low voltage operational amplifier 10 in FIG. 1 operates in a voltage range of eight volts to one volt over a temperature range of 0° to 70° centigrade. Op amp input stage 12 uses N-channel depletion-mode MOSFETs 30 and 32 (see FIG. 2) to provide amplification of the input $V_{IN}$ and maintain constant transconductance. Source follower MOSFET 13 (see FIG. 1) provides unity gain in transferring the AC signal, STAGE-1 OUTPUT, to the base of current sinking transistor 18. A separate DC loop through sink control circuit 14 and source control circuit 22, creates the bias for the base drive current in transistors 18 and 24. Dependent on the input signal the AC signal path on SINK PASS THROUGH signal controls op amp output sink transistor to sink current or through translinear loop 16 causes SOURCE PASS THROUGH signal controlling op amp output source transistor to source current. An output stage provides approximately fifty milliamps of sink and source current.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A low voltage operational amplifier comprising:
    an input stage having an input coupled for receiving an input signal and having an output, the input stage including:
        a first depletion-mode metal oxide semiconductor field effect transistor (MOSFET) having a source terminal, a drain terminal, and a gate terminal; and
        a second depletion-mode MOSFET having a source terminal, a drain terminal, and a gate terminal, wherein the source terminals of the first and second depletion-mode MOSFETs are commonly coupled to form a differential pair and the gate terminals serve as differential inputs of the differential pair;
    a source follower having a gate terminal, a drain terminal, and a source terminal, wherein the gate terminal of the source follower is coupled to the input stage;
    a bias circuit having an input coupled to the source terminal of the source follower, wherein the bias circuit provides a first bias output signal and a second bias output signal; and
    an output driver stage coupled to the bias circuit and to the source terminal of the source follower, wherein the output driver stage receives the first bias output signal and the second bias output signal and provides an output signal.

2. A low voltage operational amplifier as claimed in claim 1, wherein the source follower is a depletion-mode MOSFET.

3. A low voltage operational amplifier as claimed in claim 2, wherein the source follower is processed in a P-type well.

4. A low voltage operation amplifier as claimed in claim 1, further comprising a frequency pole splitting circuit coupled between the output driver stage and the op amp input stage output.

5. A low voltage operational amplifier as claimed in claim 1, further comprising a current sink coupled between the source terminal of the source follower and ground reference.

6. A low voltage operational amplifier as claimed in claim 1, wherein the low voltage operational amplifier operates at a voltage down to one volt.

7. A low voltage operational amplifier as claimed in claim 1, wherein the low voltage operational amplifier operates over a temperature range of about zero degrees Celsius to about 70 degrees Celsius.

8. A low voltage operational amplifier as claimed in claim 1, wherein the bias circuit comprises:
   a source control circuit providing a source pass through;
   a sink control circuit coupled to the source follower, the sink control circuit for providing a sink pass through; and
   a translinear loop coupled to the sink control circuit and to the source control circuit, the translinear loop for receiving the sink pass through and for producing the second bias output therefrom.

9. A low voltage operational amplifier as claimed in claim 1, wherein the op amp input stage comprises N-channel depletion-mode Metal Oxide Semiconductor Field Effect Transistors (MOSFETs) to provide amplification and to exhibit minimal transconductance changes.

10. A method for amplifying a differential input signal in a low voltage operational amplifier, the method comprising the steps of:
   receiving the differential input signal;
   amplifying the differential input signal using N-channel depletion-mode metal oxide semiconductor field effect transistors (MOSFETs) to generate an output signal of the input stage;
   transferring the output signal of the input stage to a translinear loop and an output driver stage using an N-channel depletion-mode MOSFET;
   transferring an output signal of the N-channel depletion-mode MOSFET source follower to the output driver stage; and
   generating an output signal from an output driver stage.

11. A method as claimed in claim 10, wherein the step of providing a first bias output and a second bias output from the op amp input stage output comprises the steps of:
   generating a source pass through from a source control circuit;
   generating a sink pass through from a sink control circuit; and
   steering the sink pass through and the source pass through in response to the differential input to produce the first bias output and the second bias output.

12. A method for transferring an alternating current (AC) signal from an input of an operational amplifier (op amp) input stage to a bias circuit, the method comprising the steps of:
   receiving the AC signal at the input of the op amp input stage; and
   transferring an output signal of the op amp input stage to the bias circuit using a depletion-mode metal oxide semiconductor field effect transistor (MOSFET) source follower.

13. A method as claimed in claim 12, wherein the step of transferring the output signal of the op amp input stage to the bias circuit includes transferring substantially all of the output signal of the op amp input stage to the bias circuit.

14. A method as claimed in claim 12, wherein the step of transferring the output signal of the op amp input stage further includes using an N-channel depletion-mode MOSFET configured as a source follower.

15. A method as claimed in claim 14, wherein the step of transferring the output of an op amp input stage to the bias circuit includes operating the op amp input stage at a voltage down to one volt.

16. A low voltage operational amplifier (op amp) comprising:
   an op amp input stage for receiving an input and providing an amplified output signal of the op amp input stage, wherein the input is received by a differential pair of metal oxide semiconductor field effect transistors (MOSFETs);
   a depletion-mode source follower having a gate terminal, a drain terminal, and a source terminal, wherein the gate terminal of the source follower is coupled to the input stage and receives the amplified output signal and provides an output:
   a bias circuit coupled to the output of the depletion-mode source follower, the bias circuit for receiving the amplified output signal of the op amp input stage and for providing a first bias output and a second bias output; and
   an output driver stage coupled to the bias circuit and to the op amp input stage output, the output driver stage for receiving the first bias output and the second bias output and for providing an output driver stage output.

17. A low voltage operation amplifier as claimed in claim 16, further comprising a frequency pole splitting circuit coupled between the output driver stage and the op amp input stage output.

18. A low voltage operational amplifier as claimed in claim 16, wherein the low voltage operational amplifier operates in a voltage range of about one volt to about eight volts.

19. A low voltage operational amplifier as claimed in claim 16, wherein the bias circuit comprises:
   a source control circuit providing a source pass through;
   a sink control circuit coupled to the op amp input stage, the sink control circuit for providing a sink pass through; and
   a translinear loop coupled to the sink control circuit and to the source control circuit, the translinear loop for receiving the sink pass through and for producing the second bias output therefrom.

20. A low voltage operational amplifier as claimed in claim 16, wherein the op amp input stage and the output driver stage provides signal amplification.

* * * * *